(12) United States Patent
Wang

(10) Patent No.: US 6,420,235 B1
(45) Date of Patent: Jul. 16, 2002

(54) METHOD OF FORMING SELF-ALIGNED MASK ROM

(75) Inventor: Ling-Sung Wang, Hsinchu (TW)

(73) Assignee: Taiwan, Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/414,281

(22) Filed: Oct. 7, 1999

(30) Foreign Application Priority Data

Sep. 9, 1999 (TW) ........................................ 88115533 A

(51) Int. Cl.⁷ ........................................ H01L 21/8246
(52) U.S. Cl. ........................ 438/275; 438/276; 438/278
(58) Field of Search .................................. 438/275–278

(56) References Cited

U.S. PATENT DOCUMENTS

| | | | | |
|---|---|---|---|---|
| 5,306,657 A | * | 4/1994 | Yang | |
| 5,670,402 A | * | 9/1997 | Sogawa et al. | |
| 5,681,772 A | * | 10/1997 | Chen et al. | |
| 5,691,216 A | * | 11/1997 | Yen et al. | |
| 6,091,119 A | * | 7/2000 | Wu | 257/390 |

\* cited by examiner

*Primary Examiner*—Jey Tsai
(74) *Attorney, Agent, or Firm*—J.C. Patents

(57) ABSTRACT

A method of forming a self-aligned mask ROM. Gate stacks that serve as word lines are formed over a substrate. Each gate stack includes a gate oxide layer, a gate conductive layer and a gate cap layer. Spacers are next formed on the sidewalls of the gate stacks. An insulation layer is deposited over the substrate and the gate stacks. The insulation layer is planarized to expose the gate cap layer. A patterned photoresist layer is formed over the insulation layer to expose the ion implant regions needed for programming. Using the patterned photoresist layer as an etching mask, the gate cap layer within each ion implant region is removed to expose the gate conductive layer using an etchant with high etching selectivity. Using the patterned photoresist layer as an implant mask, ions are implanted into the substrate via the ion implant regions so that the mask ROM is programmed. Finally, the photoresist layer is removed.

18 Claims, 4 Drawing Sheets

METHOD OF FORMING SELF-ALIGNED MASK ROM

CROSS-REFERENCE TO RELATED APPLICATION

This application claims the priority benefit of Taiwan application serial no. 88115533, filed Sep. 9, 1999, the full disclosure of which is incorporated herein by reference.

BACKGROUND OF THE INVENTION

1. Field of Invention

The present invention relates to a method of forming a mask ROM. More particularly, the present invention relates to a method of forming a mask ROM that can be programmed by a self-aligned implantation.

2. Description of Related Art

Mask ROM is generally made from a number of channel transistors, each serving as a memory unit. When programming is required, ions are implanted into the channel region of selected memory cells so that threshold voltage of these cells is modified. The 'on' or 'off' state of each memory cell is thus set. In general, a memory cell is created whenever a word line (WL) crosses over a bit line (BL). The memory cell is formed in the word line covered area between two neighboring bit lines. Each memory cell is capable of storing a binary bit of data, either in a logic state of '0' or '1' depending on whether the channel region of the memory cell is implanted or not.

FIG. 1 is a schematic top view of a portion of a conventional mask ROM. As shown in FIG. 1, a set of parallel word lines 102 crosses over a set of perpendicular bit lines 104. At their intersections, ion implant regions 110 are formed. Programming is done by implanting ions into selected ion implant regions 110 so that threshold voltage of the memory cell is modified and an 'on' or 'off' state of a memory cell is set.

However, as the production of a mask ROM progresses into the deep submicron level, the level of circuit integration becomes higher and dimensions of each device shrinks. Any slight misalignment of the ion beam is likely to send ions into a region shifted both horizontally (perpendicular to the bit line 104) and vertically (perpendicular to the word line 102) away from the desired ion implant region 110. Besides the possibility of causing programming errors, misalignment may also result in interference with surrounding implant regions and hence may indirectly affect the operation of the memory. The effect is particularly serious when the shift is mainly in a vertical direction (that is, perpendicular to the word line 120).

SUMMARY OF THE INVENTION

The present invention provides a method of forming a self-aligned mask ROM capable of reducing programming errors due to the misalignment between an ion implanting region and a bit line gate. Moreover, the method is also capable of preventing interference problems due to the diffraction of ions during ion implantation and the diffusion of ions within the substrate.

To achieve these and other advantages and in accordance with the purpose of the invention, as embodied and broadly described herein, the invention provides a method of forming a self-aligned mask ROM. Gate stacks that serve as word lines are formed over a substrate. Each gate stack includes a gate oxide layer, a gate conductive layer and a gate cap layer. Spacers are next formed on the sidewalls of the gate stacks. An insulation layer is deposited over the substrate and the gate stacks. The insulation layer is planarized to expose the gate cap layer. A patterned photoresist layer is formed over the insulation layer to expose the ion implant regions needed for programming. Using the patterned photoresist layer as an etching mask, the gate cap layer within each ion implant region is removed to expose the gate conductive layer using an etchant with high etching selectivity. Using the patterned photoresist layer as an implant mask, ions are implanted into the substrate via the ion implant regions so that the mask ROM is programmed. Since both sides of each gate stack are protected by the insulation layer, ions can reach the substrate through the gate stack, only. Hence, the memory programming is a self-aligned ion implant process. Finally, the photoresist layer is removed.

The advantage of the self-aligned mask ROM of this invention is that programming can be achieved through a simple ion implant operation. There is no need to worry about ion beam misalignment because ions can only get to the substrate via the word line gate of each ion implant region. Hence, conventional programming errors due to misalignment between an ion implant region and a corresponding word line gate and interference problems due to the diffraction of ions during ion implantation and the diffusion of ions within substrate thereafter can be eliminated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
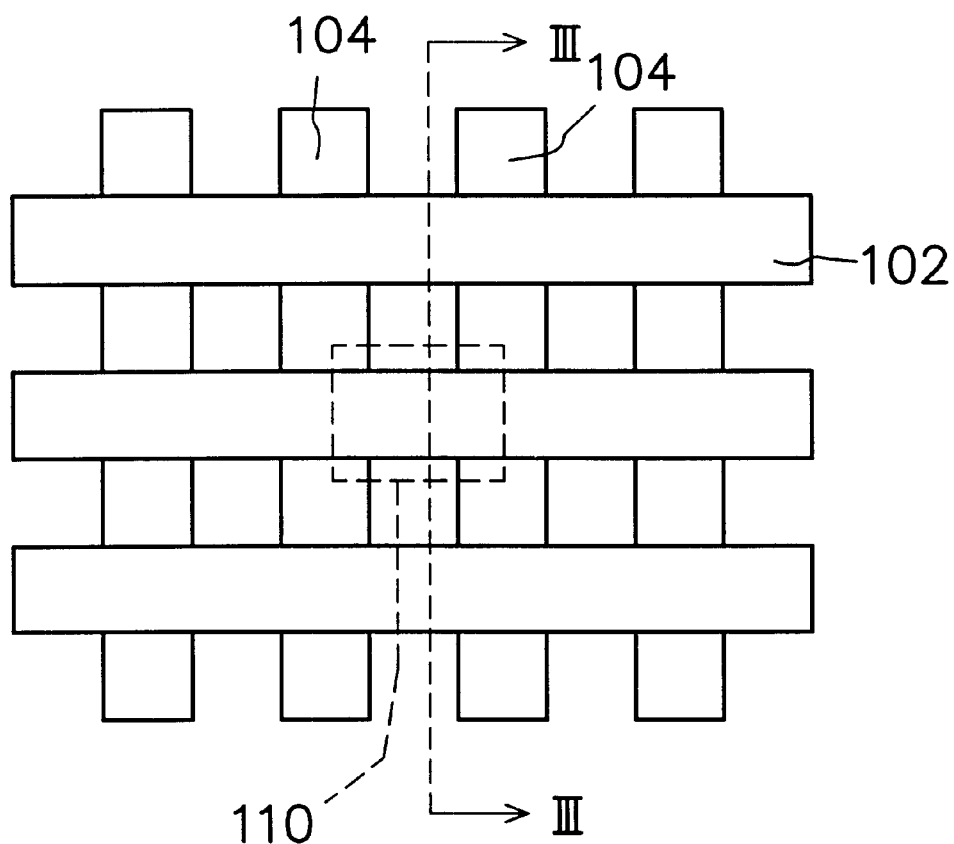
FIG. 1 is a schematic top view of a portion of a conventional mask ROM.

Reference will now be made in detail to the present preferred embodiments of the invention, examples of which are illustrated in the accompanying drawings. Wherever possible, the same reference numbers are used in the drawings and the description to refer to the same or like parts.

This invention provides a method of forming a self-aligned mask ROM whose view from the top is structurally similar to that shown in FIG. 1. FIGS. 2A through 2G are schematic cross-sectional views along line III—III of FIG. 1 showing the progression of steps for forming a self-aligned mask ROM according to one preferred embodiment of this invention.

Before word lines 102 are fabricated, bit lines 104 can be selectively produced. The bit lines can be buried bit lines parallel to each other. The buried bit lines can be formed by, for example, forming a patterned mask layer so that positions of the bit lines 104 are marked, and performing an ion implantation thereafter.

Figure 2A:
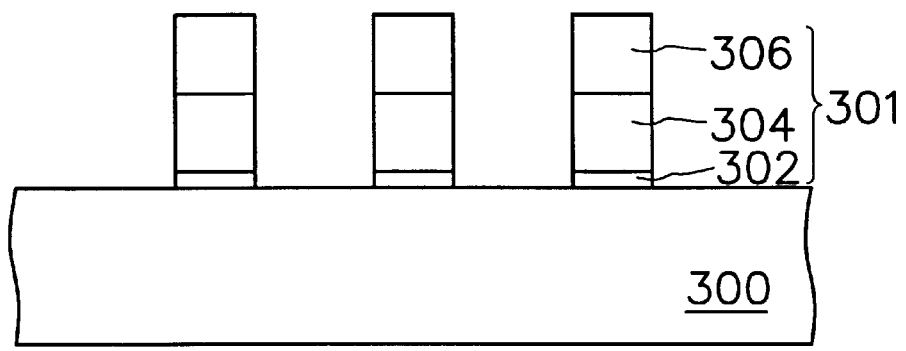
FIGS. 2A through 2G are schematic cross-sectional views along line III—III of FIG. 1 showing the progression of steps for forming a self-aligned mask ROM according to one preferred embodiment of this invention.

As shown in FIG. 2A and FIG. 1, gate stacks 301 that serve as word lines 102 (in FIG. 1) are formed over a substrate 300. To form the gate stacks 301, a gate oxide layer 302, a gate conductive layer 304 and a gate cap layer 306 are sequentially formed over the substrate 300. The gate oxide layer 302, the gate conductive layer 304 and the gate cap layer 306 are subsequently patterned by carrying out photolithographic and etching processes. The gate oxide layer 302 can be a silicon oxide layer formed by, for example, thermal oxidation. The gate conductive layer 304 can be a polysilicon layer and the gate cap layer 306 can be a silicon oxide layer. Both the gate conductive layer 304 and the gate cap layer can be formed by, for example, chemical vapor deposition (CVD).

Figure 2B:
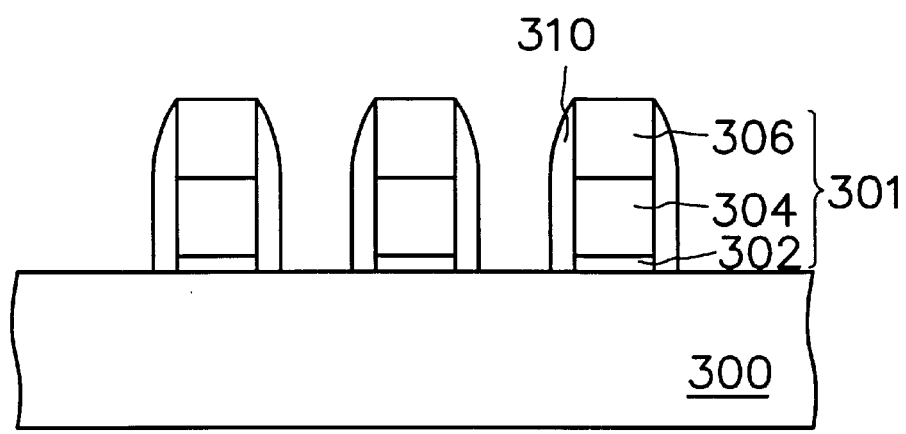

Gate spacers 310 are formed on the sidewalls of the gate stacks as shown in FIG. 2B. To form the gate spacers 310, a conformal silicon nitride layer having a thickness of about 1500 Å is formed over the substrate 300 by chemical vapor deposition. The silicon nitride layer is then etched to remove a large portion so that only a small-portion of the silicon nitride layer remains on the sidewalls of the gate stacks 301.

Figure 2C:
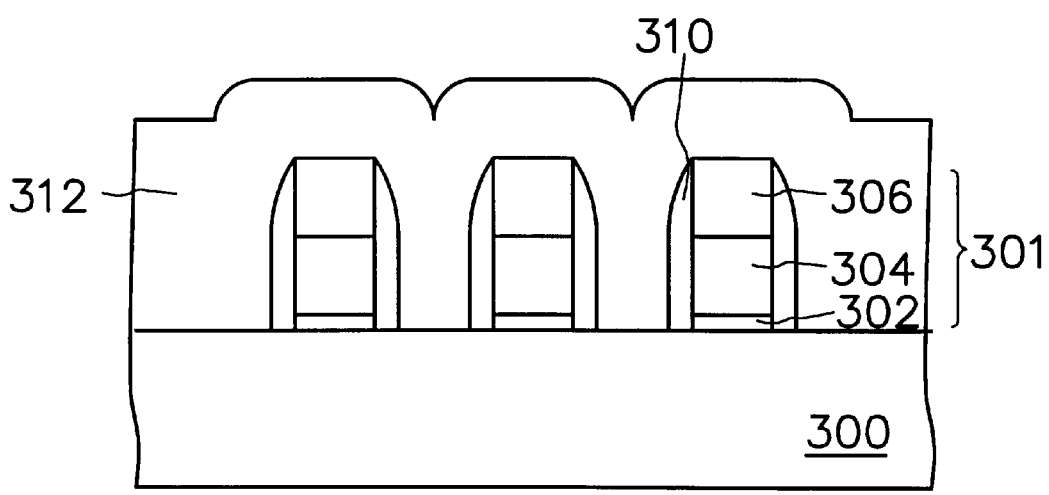

An insulation layer 312 that fills the space between neighboring gate stacks 301 is formed over the substrate 300 as shown in FIG. 2C. The insulation layer 312 having a thickness of between about 2000 Å and 3000 Å can be a silicon nitride layer formed by, for example, chemical vapor deposition (CVD).

Material for forming the gate spacers 310 and the insulation layer 312 must be carefully selected. This is because excessive removal of material from the gate spacers or insulation layer, when the cap layer 306 is subsequently etched, is undesirable. In general, the etching rate of both the spacers 310 and the insulation layer 312 must be considerably lower than the etching rate of the cap layer 306. However, a range of different materials can be used to form the spacers 310 and the insulation layer 312 once a material is chosen for the cap layer 306.

Figure 2D:
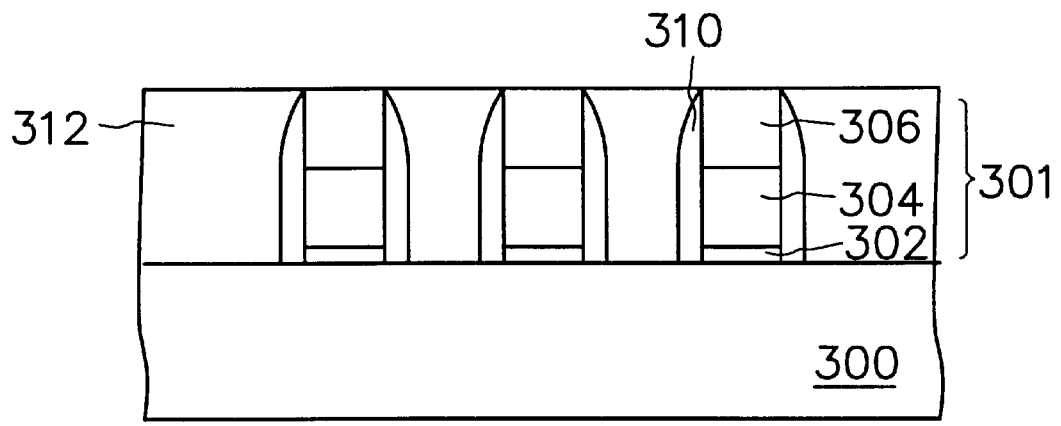

The insulation layer 310 is planarized to expose the cap layer 306 as shown in FIG. 2D. The planarization can be carried out by, for example, etching back or chemical-mechanical polishing (CMP).

Figure 2E:
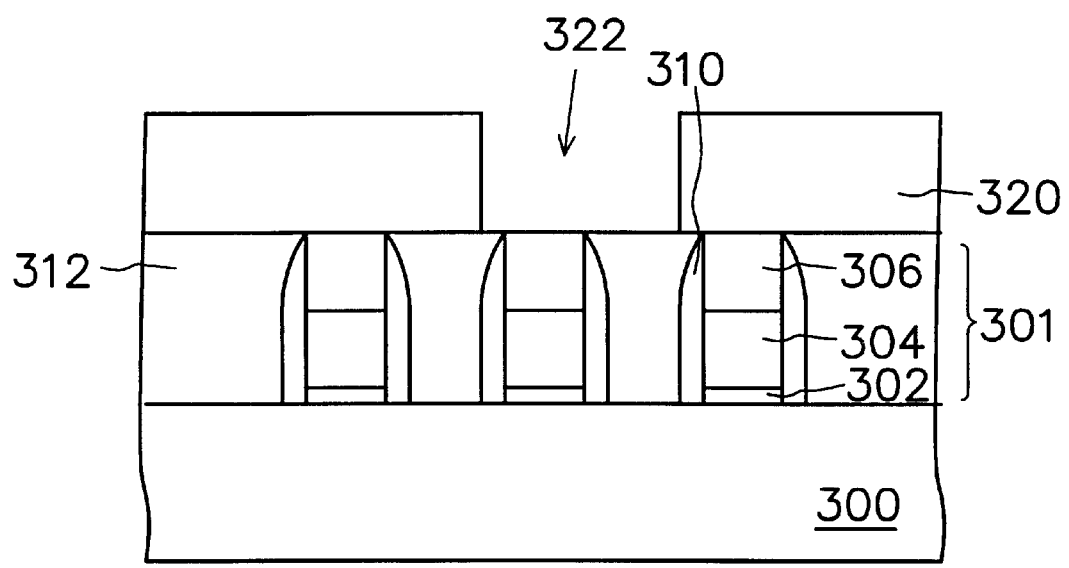

A patterned photoresist layer 320 is formed over the insulation layer 312 and the cap layer 306 as shown in FIG. 2E. The photoresist layer 320 has an opening 322 exposing an ion implant region through which opening ions can be subsequently implanted. In other words, ion implant regions (region 110 in FIG. 1) for memory programming are formed after this step. In general, an ion implant region 110 encloses a word line 102 between two neighboring bit lines 104 as shown in FIG. 1. The ion implant regions together form a pattern containing the code for an entire program to be transferred to the mask ROM. The openings 322 for exposing ion implant regions can be formed by a conventional photolithographic process.

Figure 2F:
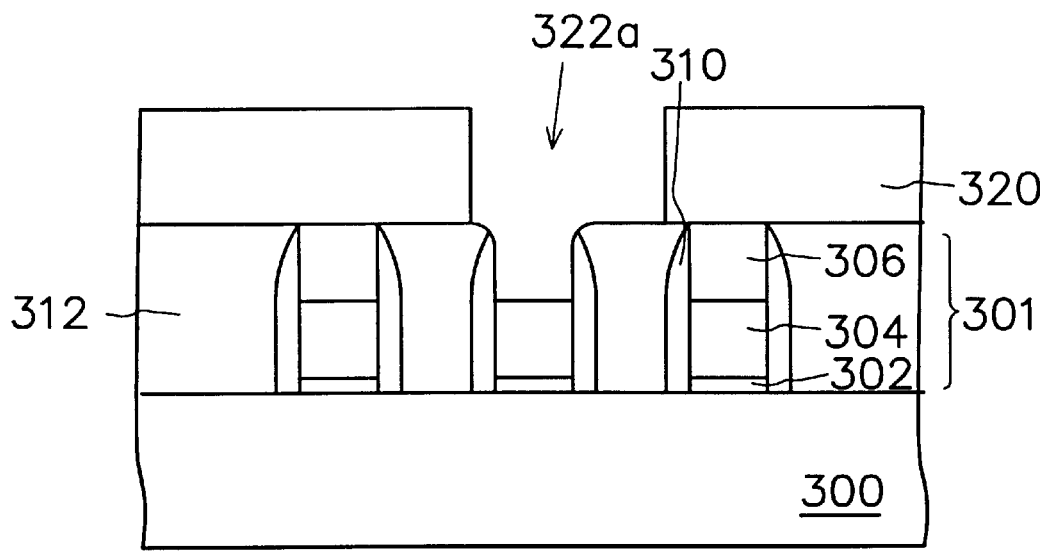

The cap layer 306 is removed using an etchant as shown in FIG. 2F. The etchant must have a much higher etching rate for the cap layer 306 than for the insulation layer 312 or the spacers 310. For example, the cap layer 306 can be etched anisotropically using an etchant that contains a carbon/fluorine compound and some inert gas. Ultimately, the gate conductive layer 304 is exposed to form an ion implant opening 322a without removing too much of the insulation layer 312 and the spacers 310.

Figure 2G:
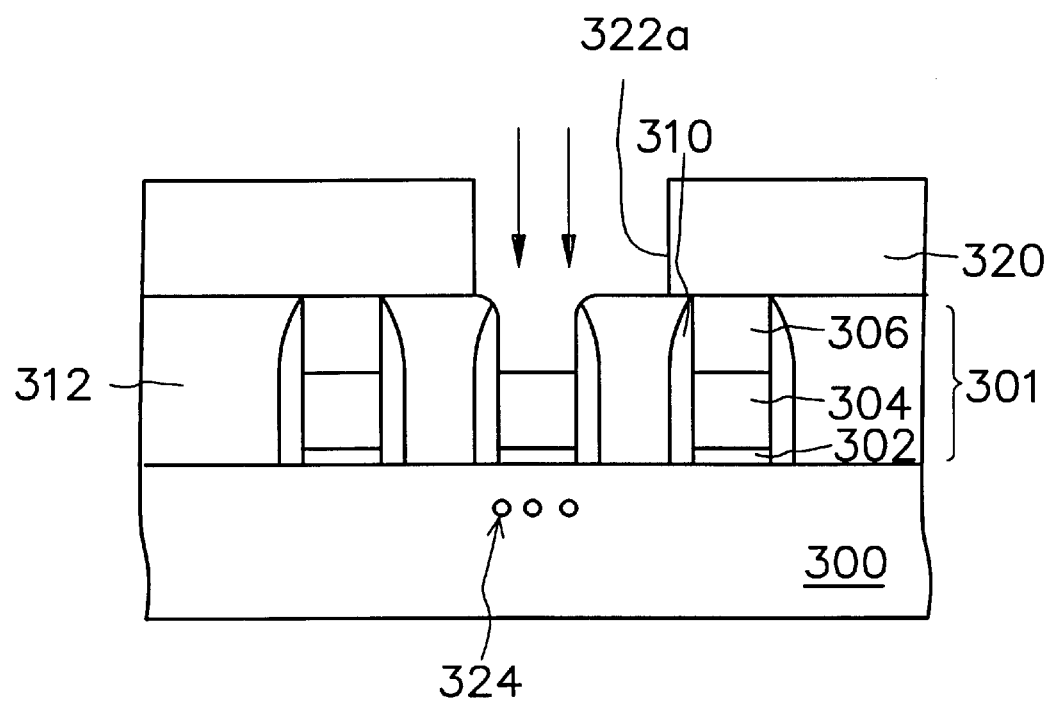

An anisotropic ion implantation is carried out so that the mask ROM is programmed as shown in FIG. 2G. Using the photoresist layer 320 as an ion mask, activated boron ions at an energy level of about 100 KeV are used in the implantation. Consequently, ions are trapped inside the substrate 300 in a region under the exposed gate conductive layer 304 and threshold voltage of the memory cell is modified. Since both sides of each gate stack 301 are protected by an insulating barrier layer (gate spacer 310 and insulation layer 312), ions mainly go through the gate stack 301 instead of the sides. Because the ion implantation is principally a self-aligned process, programming results are unaffected by errors in ion beam alignment. In addition, interference from neighboring ion implant regions is completely avoided. Finally, the photoresist layer 320 is removed before subsequent processing operations are carried out.

In summary, the method of forming a self-aligned mask ROM according to this invention is capable of preventing programming errors due to misalignment between ion implant regions and gates. Furthermore, interference from neighboring ion implant regions due to the diffraction of ions during ion implantation and the diffusion of ions within the substrate thereafter can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a self-aligned mask ROM, comprising the steps of:

forming a gate stack above a substrate, wherein the gate stack includes a gate oxide layer, a gate conductive layer and a gate cap layer;

forming spacers on sidewalls of the gate stack;

depositing insulating material over the substrate to form an insulation layer;

planarizing the insulation layer to expose the gate cap layer;

forming a patterned photoresist layer over the planarized insulation layer so that an ion implant region is exposed;

removing the gate cap layer within the ion implant region using the photoresist layer as an etching mask, so that a portion of the gate cap layer covered by the photoresist layer remains;

implanting ions into the substrate via the ion implant region using the photoresist layer as an implant mask; and removing the photoresist layer.

2. The method of claim 1, wherein material forming the gate conductive layer includes polysilicon.

3. The method of claim 1, wherein material forming the gate cap layer includes silicon oxide.

4. The method of claim 1, wherein materials forming the spacers and the insulation layer have respective etching rates considerably lower than that of the material forming the gate cap layer.

5. The method of claim 4, wherein material forming the spacers includes silicon nitride.

6. The method of claim 4, wherein material forming the insulation layer includes silicon nitride.

7. The method of claim 1, wherein the step of planarizing the insulation layer includes etching.

8. The method of claim 1, wherein the step of planarizing the insulation layer includes chemical-mechanical polishing.

9. A method of forming a self-aligned mask ROM over a substrate, comprising the steps of:

forming a plurality of bit lines in the substrate;

forming a plurality of word lines above the substrate perpendicular to the bit lines, wherein each word line includes a gate oxide layer, a gate conductive layer and a gate cap layer;

depositing insulating material into the space between the word lines to form an insulation layer;

forming a patterned photoresist layer over the word lines and the insulation layer such that a plurality of openings for self-aligned mask ROM programming are exposed;

removing the gate cap layer within the program openings, so that a portion of the gate cap layer covered by the photoresist layer remains; and programming the mask ROM by planting dopants into the substarate via the program openings using the photoresist layer as an implant mask.

10. The method of claim 9, wherein material forming the gate conductive layer includes polysilicon.

11. The method of claim 9, wherein material forming the gate cap layer includes silicon oxide.

12. The method of claim 9, wherein the step of filling the spacer between word lines includes the substeps of:

depositing insulating material over the substrate and the word lines to form an insulation layer; and planarizing the insulation layer until the word lines are exposed.

13. The method of claim 12, wherein the step of planarizing the insulation layer includes etching.

14. The method of claim 12, wherein the step of planarizing the insulation layer includes chemical-mechanical polishing.

15. The method of claim 9, wherein material forming the insulation layer has an etching rate considerably smaller than that of material forming the gate cap layer.

16. The method of claim 15, wherein material forming the insulation layer includes silicon nitride.

17. The method of claim 9, wherein before the step of forming the insulation layer, further includes forming spacers on the sidewalls of the word lines.

18. The method of claim 9, wherein the step of planting dopants into the substrate via the program openings includes an ion implantation.

* * * * *